(12) United States Patent
Lee et al.

(10) Patent No.: US 6,765,772 B2
(45) Date of Patent: Jul. 20, 2004

(54) ELECTROSTATIC DISCHARGE PROTECTION DEVICE

(75) Inventors: Jian-Hsing Lee, Pu-Tzu (TW); Hung-Der Su, Hsi-Chi (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 244 days.

(21) Appl. No.: 09/963,559

(22) Filed: Sep. 27, 2001

(65) Prior Publication Data

US 2002/0191358 A1 Dec. 19, 2002

(30) Foreign Application Priority Data

Jun. 18, 2001 (TW) ........................................ 90114757 A

(51) Int. Cl.[7] ............................................... H02H 9/00
(52) U.S. Cl. ....................................................... 361/56
(58) Field of Search ............................ 361/56, 88, 91, 361/111

(56) References Cited

U.S. PATENT DOCUMENTS 5,959,820 A * 9/1999 Ker et al. ................... 361/111

* cited by examiner

Primary Examiner—Brian Sircus
Assistant Examiner—Boris Benenson
(74) Attorney, Agent, or Firm—Birch, Stewart, Kolasch & Birch, LLP

(57) ABSTRACT

The present invention determines the ESD event by detecting the voltage value of the power source. The numbers N of the diodes 441 have to follow the condition of:

$$N \times VT(0.7) > Vcc \text{ (core)}$$

Therefore, the diodes 441 will not influence normal operation outside of ESD events. When an ESD pulse is generated, the PN junction of the PMOS transistor is turned on, so the voltage value of Vcc is raised. At this time, the voltage value of Vcc (core) is "Vcc−0.7−N1×(0.7)", N1 represents the numbers of diodes between Vcc (core) and Vcc, which follows the condition of "N1×(0.7)>Vcc—Vcc (core)" to ensure the diodes remain turned on in normal operation.

19 Claims, 3 Drawing Sheets

ELECTROSTATIC DISCHARGE PROTECTION DEVICE

BACKGROUND OF THE INVENTION

1. Field of the Invention

The present invention relates in general to an electrostatic discharge protection device. In particular, the present invention relates to a device that adjusts the condition of the discharging device to enhance discharge efficiency when an ESD event is detected.

2. Description of the Related Art

Electrostatic discharge (ESD) is a common phenomenon that occurs during handling of semiconductor integrated circuit (IC) devices. Electrostatic charges may accumulate and cause potentially destructive effects on an IC device. ESD stress typically occurs during the testing phase of IC fabrication, during installation of the IC onto a circuit board, as well as during use of equipment into which the IC has been installed. Damage to a single IC due to poor ESD protection in an electronic device can partially, or sometimes completely, hamper its operation.

There are several ESD stress models based on the reproduction of typical discharge pulses to which the IC may be exposed during manufacturing or handling. Three standard models, known as the Human Body Model (HBM), Machine Model (MM), and Charged Device Model (CDM) have been proposed. The human-body model is set forth in U.S. Military Standard MIL-STD-883, Method 3015.6. The military standard models the electrostatic stress produced on an IC device when a human carrying electrostatic charges touches the lead pins of the IC device. The machine model is set forth in Industry Standard EIAJ-IC-121, and describes the electrostatic stress produced on an IC device when a machine carrying electric charges contacts the lead pins of the IC device. The charged device model describes the ESD current generated when an IC already carrying electric charges is grounded when being handled.

FIG. 1 is a block diagram according to the conventional electrostatic discharge protection device. The semiconductor device comprises an internal circuit 30 and pad 10, and an electrostatic discharge protection device 20 (take as ESD device, hereinafter ) is set up between the internal circuit 30 and pad 10 to prevent ESD event.

ESD device 20 comprises an I/O buffer circuit 22, a pre-driver N circuit 24, a pre-driver P circuit 25, and switching circuits 26 and 27. I/O buffer circuit 22 protects the internal circuit 30 from ESD current damage. There are a first discharge path through NMOS transistor and a second discharge path through PMOS transistor in the I/O buffer circuit 22. As well, some NMOS transistors and PMOS transistors in the I/O buffer circuit 22 are operated depending on the signals output by the pre-driver N circuit 24 and pre-driver P circuit 25, respectively. Because the operations of the pre-driver P circuit 25 and the switching circuits 27 are similar to the pre-driver N circuit 24 and the switching circuits 26, the following description only relates the pre-driver N circuit 24 and the switching circuits 26 to simplify the illustration.

FIG. 2 is a block diagram of the I/O buffer circuit 22, the pre-driver N circuit 24, and the switching circuits 26 in FIG. 1. I/O buffer circuit 22 comprises a plurality of NMOS transistors (M20A, M21A, M22A, and M23A) and PMOS transistors (M20B, M21B, M22B, and M23B). The drains of the NMOS transistors are coupled to the corresponding drains of the PMOS transistors, and their connection points are coupled to the connection points between pad 10 and internal circuit 30. In addition, the sources of the NMOS transistors (M20A, M21A, M22A, and M23A) are coupled to ground. The gates of NMOS transistors M20A and M21A are coupled to ground, and the gates of NMOS transistors M22A and M23A are coupled to the output of pre-driver N circuit 24. Similarly, the sources of the PMOS transistors (M20B, M21B, M22B, and M23B) are coupled to a power source. The gates of PMOS transistors M20B and M21B are coupled to the power source, and the gates of PMOS transistors M22B and M23B are coupled to the output of pre-driver P circuit 25.

First switch circuit 26 is a NOR logic gate, which outputs specific level signals according to the output enable signal OEN and operation signal SIGNAL.

The pre-driver N circuit 24 comprises a plurality of NMOS transistors and PMOS transistors, which outputs specific level signals according to the output level of the first switch circuit 26. For example, when the first switch circuit 26 outputs high level signal, pre-driver N circuit 24 outputs high level signal to the gates of NMOS transistors M22A and M23A; when the first switch circuit 26 outputs low level signal, pre-driver N circuit 24 outputs low level signal to the gates of NMOS transistors M22A and M23A. Moreover, the semiconductor devices use multi-operation voltages recently, one is used in internal circuit, and the other is used in I/O elements. Therefore, the pre-driver N circuit 24 further can adjust the voltage level. For example, the first high-level voltage 1.8V output by the internal circuit is changed by the pre-driver N circuit 24 to the second high-level voltage 3.3V to provide to I/O elements.

During an ESD event, the voltage difference between the pad 10 and ground is higher than the break down voltage of NMOS transistor. Therefore, NMOS transistors (M20A, M21A, M22A, and M23A) are expected to break down at the same time and the ESD current is released to ground to prevent the ESD current from damaging internal circuit 30.

However, the actual operation of the I/O buffer circuit 22 (I/O elements) does not follow the above description. The reason is that the pre-driver N circuit 24 provides high level signal to the gates of the NMOS transistors M22A and M23A during ESD event. Thus, NMOS transistors M22A and M23A will turn on before NMOS transistors M20A and M21A break down. Therefore, massive ESD current flows to ground through NMOS transistors M22A and M23A and prevents NMOS transistors M20A and M21A from breaking down, decreasing ESD current discharge ability.

SUMMARY OF THE INVENTION

The object of the present invention is to provide an electrostatic discharge protection device, coupling the gates of NMOS transistors M20A, M21A, M22A and M23A to the ground level when the pad 10 suddenly receives ESD current. Therefore, each NMOS transistor will break down at the same time to enhance discharge efficiency. Moreover, the discharge paths of ESD current are through NMOS transistors M20A, M21A, M22A and M23A equally, so the amount of ESD current passing through each NMOS transistor is decreased and prevent ESD current damaging the MOS transistors.

The present invention determines the ESD event by detecting the voltage value of the power source. The numbers N of the diodes 141 have to follow the condition of:

$$N \times V_T(0.7) > Vcc(\text{core})$$

Therefore, the diodes 141 will not influence normal operation outside of ESD events. When an ESD pulse is generated, the PN junction of the PMOS transistor is turned on, so the voltage value of Vcc is raised. At this time, the voltage value of Vcc(core) is "Vcc−0.7−N1×(0.7)", N1 represents the numbers of diodes between Vcc(core) and Vcc, which follows the condition of "N1×(0.7)>Vcc−Vcc (core)" to ensure the diodes remain turned on in normal operation.

Then, the raised Vcc turns on the diode string 441 and high level signal is output from diode string. Next, the high level signal is converted to low level signal by driving circuit and output to NMOS transistor. Therefore, all gates of NMOS transistors are connected to low level signal and all NMOS transistors in I/O buffer circuit 22 break down at the same time.

To achieve the above-mentioned object, the present invention provides an electrostatic discharge protection device located between a pad and an internal circuit and coupled to a first level signal and a second level signal. The electrostatic discharge protection device comprises a voltage detecting device, a signal converting device, and switches. The voltage detecting device detects the voltage level of the first level signal, and outputs a detecting result signal when the voltage level of the first level signal reaches a first predetermined value. The signal converting device outputs the second level signal while receiving the detecting result signal. The first switch has a first controlling gate, and turns on when the voltage level of the pad reaches a second predetermined voltage level. The second switch has a second controlling gate, and turns on and raises the voltage value of the first level signal when the voltage level of the pad reaches a third predetermined voltage level. The third switch has a third controlling gate and turns on when the voltage level of the pad reaches the second predetermined voltage level and the third controlling gate receives the second level signal.

BRIEF DESCRIPTION OF THE DRAWINGS

The present invention will become more fully understood from the detailed description given hereinbelow and the accompanying drawings, given by way of illustration only and thus not intended to be limitative of the present invention.

DETAILED DESCRIPTION OF THE PREFERRED EMBODIMENT

Figure 1:
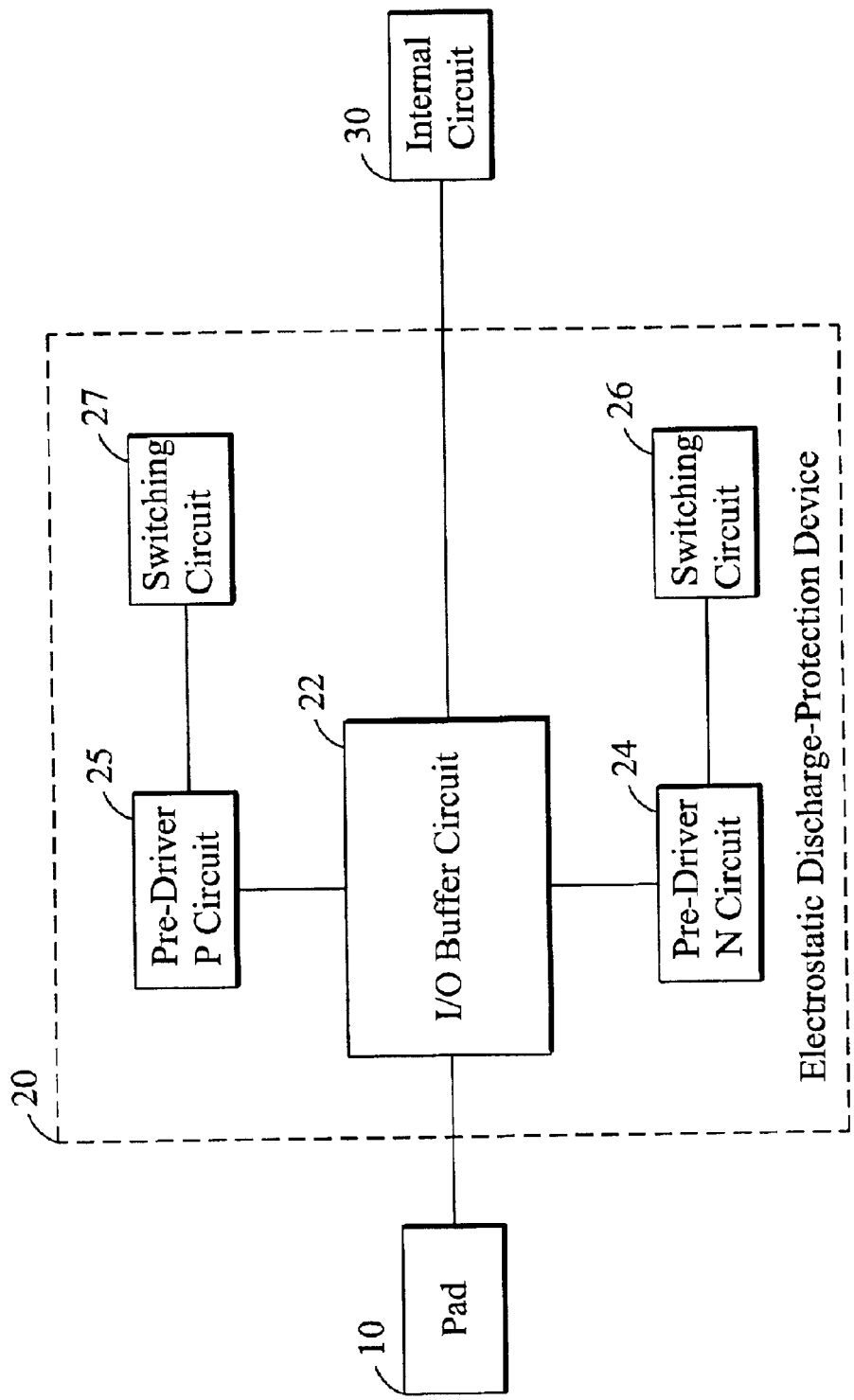
FIG. 1 is a block diagram of a conventional electrostatic discharge protection device.
Figure 2:
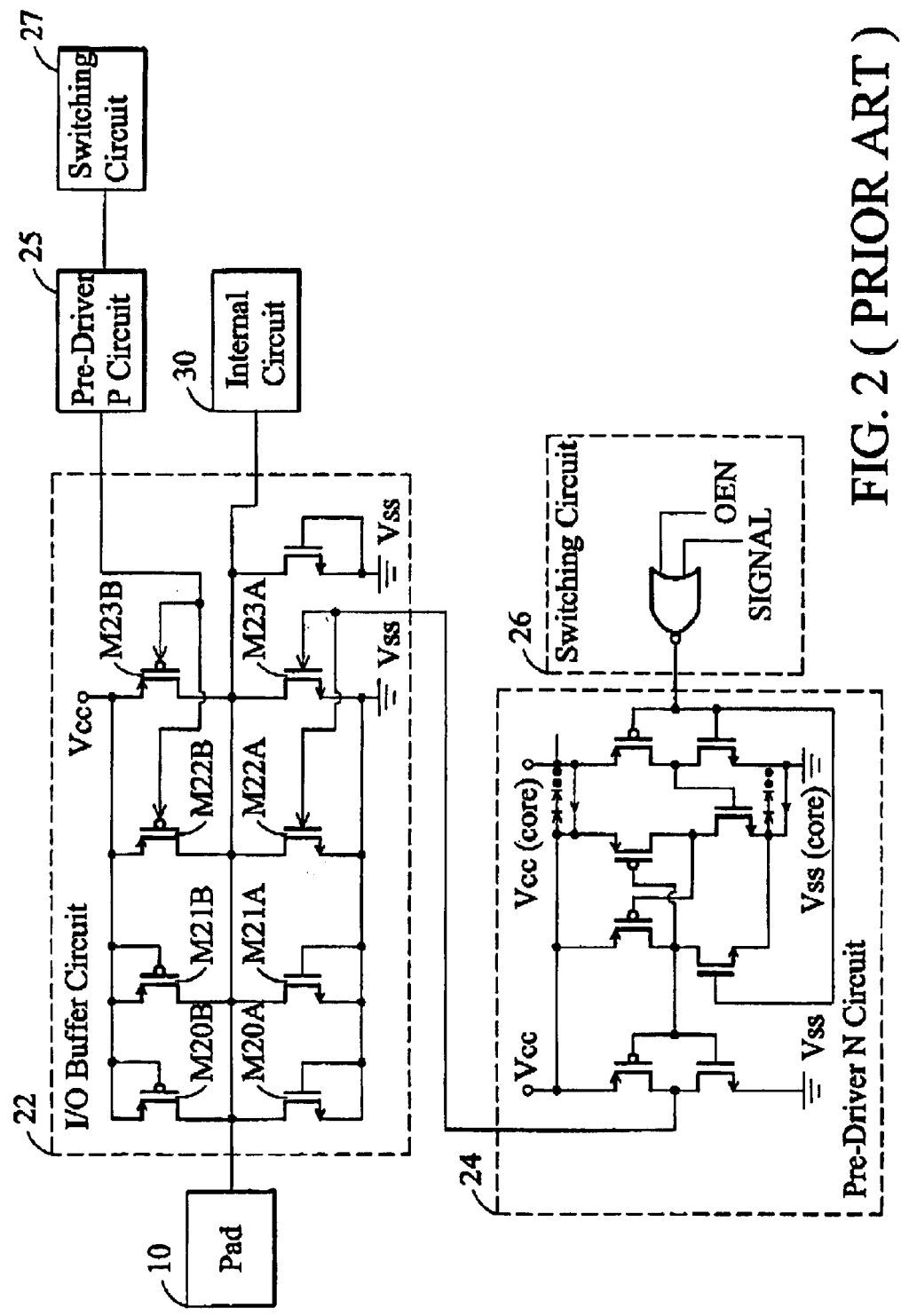
FIG. 2 is a block diagram of the I/O buffer circuit 22, the pre-driver N circuit 24, and the switching circuits 26 in FIG. 1.
Figure 3:
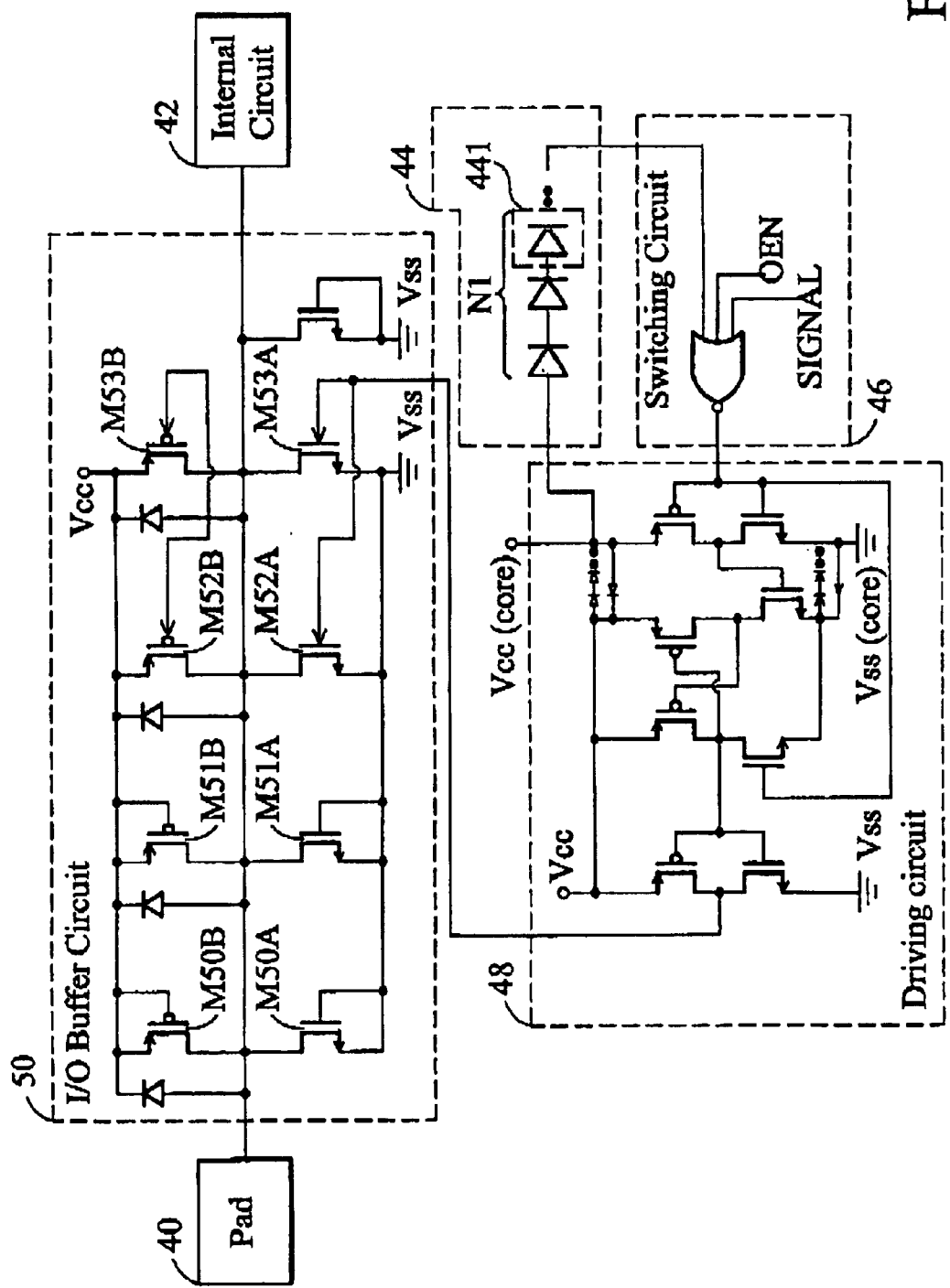
FIG. 3 is an architecture diagram of the electrostatic discharge protection device according to the embodiment of the present invention.

FIG. 3 is an architectural diagram of the electrostatic discharge protection device according to the embodiment of the present invention. The electrostatic discharge protection device according to the present embodiment is located between a pad 40 and an internal circuit 42.

The voltage detecting device 44 detects the voltage level of the third level signal Vcc(core). In the present embodiment, the voltage detecting device 44 comprises at least one serial diodes (diode string) 441. The number of diodes is determinated according to the voltage level of the third level signal Vcc(core). That is, the turn-on voltage of the diode string 441 must be larger than Vcc(core) during normal operation. Therefore, in normal operation, the detecting result signal output by the voltage detecting device 44 is low level signal. For example, if the turn-on voltage of a single diode is 0.7V and the third level signal Vcc(core) is 1.2V, the number of serial diodes must be more than two (0.7×2=1.4>1.2). Therefore, the diode string 441 outputs low level signal.

When the third level signal Vcc(core) is raised by ESD current and reaches a predetermined level (6V for example) higher than the turn-on voltage of the diode string 441, the diode string 441 turns on and outputs a detecting result signal with high level to switching circuit 46.

In the present embodiment, the switching circuit 46 is a NOR logic gate. No matter what level of output enable signal OEN and operation signal SIGNAL is, the switching circuit 46 outputs ground level signal to driving circuit 48 when the detecting result signal is in low level.

The driving circuit 48 comprises a plurality of NMOS transistors and PMOS transistors, which outputs specific level signals according to the output level of the switching circuit 46. For example, when the switching circuit 46 outputs high level signal, driving circuit 48 outputs high level signal to the gates of NMOS transistors M52A and M53A; when the switching circuit 46 outputs low level signal, driving circuit 48 outputs low level signal to the gates of NMOS transistors M52A and M53A. Moreover, the semiconductor devices use multi-operation voltages recently, the driving circuit 48 further can adjust the voltage level. For example, the first high-level voltage 1.8V output by the internal circuit is changed by the driving circuit 48 to the second high-level voltage 3.3V to provide to I/O buffer circuit.

The I/O buffer circuit 50 comprises a plurality of NMOS transistors (M50A, M51A, M52A, and M53A) and PMOS transistors (M50B, M51B, M52B, and M53B). The drains of the NMOS transistors are coupled to the corresponding drains of the PMOS transistors, and their connection points are coupled to the connection points between pad 40 and internal circuit 42. In addition, the sources of the NMOS transistors (M5OA, M51A, M52A, and M53A) are coupled to ground. The gates of NMOS transistors M50A and M51A are coupled to ground, and the gates of NMOS transistors M52A and M53A are coupled to the output of driving circuit 48. Similarly, the sources of the PMOS transistors (M50B, M52B, M52B, and M53B) are coupled to power source.

As mentioned above, the gates (first controlling gate) of NMOS transistors M50A and M51A (first switch) are coupled to ground. NMOS transistors M50A and M51A are turned on when the voltage level of pad 40 reaches the second predetermined voltage level, the break down voltage of NMOS transistor. PMOS transistors (M50B, M51B, M52B, and M53B, second switch) are connected to the connection point between pad 40 and internal circuit 42, and comprise a first controlling gate connected to the power source. When the voltage level of pad 40 reaches the second predetermined voltage level, which makes PN junction of PMOS transistor turn on, the voltage level of power source is raised.

The gates (third controlling gate) of NMOS transistors M52A and M53A (third switch) are coupled to driving circuit 48. When the voltage level of pad 40 reaches the second predetermined voltage level, the gates of NMOS transistors M52A and M53A are coupled to a low level signal output by driving circuit 48, therefore, the NMOS transistors M52A and M53A and NMOS transistors M50A and M51A break down at the same time.

According to the electrostatic discharge protection device of the present invention, when the I/O buffer circuit 50 receives a large ESD current, the PN junctions of PMOS transistors (M50B, M51B, M52B, and M53B) are turned on and raise first level signal (Vcc). At this time, the third level signal Vcc(core) is raised with first level signal. When the third level signal Vcc(core) reaches a specific value (6V as example), the voltage difference between pad 40 and ground, attains the break down voltage of PMOS transistor. Therefore, the diode string 441 in the voltage detecting device 44 is turned on then outputs a high level signal. The high level signal is converted to low level signal and provided to the gates of NMOS transistors M52A and M53A through switching circuit 46 and driving circuit 48. Therefore, the gates of NMOS transistors (M50A, M51A, M52A, and M53A) are all coupled to low level signal. In this condition, the NMOs transistors (M50A, M51A, M52A, and M53A) will break down at the same time to discharge ESD current while the voltage difference between pad 40 and ground reach the break down voltage of the PMOS transistor.

Accordingly, the present invention assures that the NMOS transistors of I/O buffer circuit 50 are turned on at the same time, enhancing discharge efficiency. Moreover, the discharge paths of ESD current move through all NMOS transistors I/O buffer circuit 50 equally, so the amount of ESD current passing through each NMOS transistor is decreased and prevents the MOS transistors from damage by ESD current.

The foregoing description of the preferred embodiments of this invention has been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. An electrostatic discharge protection device located between a pad and an internal circuit, and coupled between a first power wire and a second power wire, comprising:
   a switching circuit for outputting an enable signal when receiving a detecting result signal;
   a voltage detecting device comprising at least one serial diode connected between the first power wire and the switching circuit, and outputting the detecting result signal when a voltage level of the first power wire reaches a first predetermined voltage level;
   a first switch coupled to a connection point between the pad and the internal circuit, wherein the first switch includes a first controlling gate connected to the second power wire and is turned on when a voltage level of the pad reaches a second predetermined voltage level;
   a second switch coupled to the connection point between the pad and the internal circuit, wherein the second switch includes a second controlling gate connected to the first power wire and is turned on when the voltage level of the pad reaches a third predetermined voltage level lower than the second predetermined voltage level;
   a third switch coupled to the connection point between the pad and the internal circuit, wherein the third switch includes a third controlling gate; and
   a driving circuit coupled to the switching circuit for outputting a ground level signal to the third controlling gate and causing the third switch to electrically break down concurrent with the first switch when the driving circuit receives the enable signal and the voltage level of the pad reaches the second predetermined voltage level.

2. The electrostatic discharge protection device as claimed in claim 1, wherein the first switch and the third switch are NMOS transistors.

3. The electrostatic discharge protection device as claimed in claim 2, wherein the second switch is a PMOS transistor.

4. The electrostatic discharge protection device as claimed in claim 1, wherein the first power wire provides a power source signal.

5. The electrostatic discharge protection device as claimed in claim 1, wherein the voltage level of the second power wire is ground level.

6. The electrostatic discharge protection device as claimed in claim 5, wherein the second predetermined voltage level is a break down voltage of the NNOS transistor.

7. The electrostatic discharge protection device as claimed in claim 6, wherein the third predetermined voltage level is a voltage difference to make the PMOS transistor generate leakage current.

8. The electrostatic discharge protection device as claimed in claim 1, wherein the first controlling gate, the second controlling gate, and the third controlling gate are gates of MOS transistors.

9. The electrostatic discharge protection device as claimed in claim 1, wherein the enable signal output from the switching circuit is in ground level.

10. An electrostatic discharge protection device located between a pad and an internal circuit, and coupled to a first power wire, a second power wire, and a third power wire, comprising:
    a switching circuit for outputting an enable signal when receiving a detecting result signal;
    a voltage detecting device comprising at least one serial diode connected between the third power wire and the switching circuit, and outputting the detecting result signal when a voltage level of the third power wire reaches a first predetermined voltage level;
    a first switch coupled to a connection point between the pad and the internal circuit, wherein the first switch includes a first controlling gate connected to the second power wire and is turned on when a voltage level of the pad reaches a second predetermined voltage level;
    a second switch coupled to the connection point between the pad and the internal circuit, wherein the second switch includes a second controlling gate connected to the first power wire and is turned on when the voltage level of the pad reaches a third predetermined voltage level lower than the second predetermined voltage level;
    a third switch coupled to the connection point between the pad and the internal circuit, wherein the third switch includes a third controlling gate; and
    a driving circuit coupled to the switching circuit for outputting a ground level signal to the third controlling gate and causing the third switch to electrically break down concurrent with the first switch when the driving circuit receives the enable signal and the voltage level of the pad reaches the second predetermined voltage level.

11. The electrostatic discharge protection device as claimed in claim 10, wherein the first switch and the third switch are NMOS transistors.

12. The electrostatic discharge protection device as claimed in claim 11, wherein the second switch is a PMOS transistor.

13. The electrostatic discharge protection device as claimed in claim 10, wherein the first power wire provides a first power source signal.

14. The electrostatic discharge protection device as claimed in claim 10, wherein the voltage level of the second power wire is in ground level.

15. The electrostatic discharge protection device as claimed in claim 14, wherein the second predetermined voltage level is a break down voltage of the NMOS transistor.

16. The electrostatic discharge protection device as claimed in claim 15, wherein the third predetermined voltage level is a voltage difference to make the PMOS transistor generate leakage current.

17. The electrostatic discharge protection device as claimed in claim 18, wherein the first controlling gate, the second controlling gate, and the third controlling gate are gates of MOS transistors.

18. The electrostatic discharge protection device as claimed in claim 10, wherein the voltage level of the third power wire is transformed form the voltage level of the first power wire.

19. The electrostatic discharge protection device as claimed in claim 10, wherein the enable signal output from the switching circuit is in ground level.

* * * * *